United States Patent [19]

Brighton

[11] Patent Number: 4,839,305

[45] Date of Patent: Jun. 13, 1989

[54] METHOD OF MAKING SINGLE POLYSILICON SELF-ALIGNED TRANSISTOR

[75] Inventor: Jeffrey E. Brighton, Katy, Tex.

[73] Assignee: Texas Instruments Incorporated, Dallas, Tex.

[21] Appl. No.: 212,554

[22] Filed: Jun. 28, 1988

[51] Int. Cl.⁴ .......................................... H01L 21/265
[52] U.S. Cl. ........................................ 437/41; 437/31; 437/89; 437/162; 437/228; 357/34; 357/59
[58] Field of Search ............... 437/31, 41, 67, 89, 437/90, 162, 228, 99; 357/34, 59 H

[56] References Cited

U.S. PATENT DOCUMENTS

| | | | |
|---|---|---|---|
| 4,331,708 | 5/1982 | Hunter | 437/228 |
| 4,502,914 | 3/1985 | Trumpp et al. | 437/67 |
| 4,610,730 | 9/1986 | Harrington et al. | 437/31 |
| 4,640,721 | 2/1987 | Uehara et al. | 437/31 |
| 4,716,126 | 12/1987 | Cogan | 437/41 |

FOREIGN PATENT DOCUMENTS

| | | | |
|---|---|---|---|
| 0214567 | 9/1986 | Japan | 437/41 |
| 0287233 | 12/1986 | Japan | 437/67 |
| 0140462 | 6/1987 | Japan | 437/41 |

OTHER PUBLICATIONS

"Semiconductor Enhancement for High Speed Logic", IBMTDB, vol. 28, No. 11, Apr. 1986, pp. 5014–5016.

Primary Examiner—Brian E. Hearn
Assistant Examiner—Tom Thomas
Attorney, Agent, or Firm—Michael E. Melton; Thomas R. Fitzgerald; Leo N. Heiting

[57] ABSTRACT

A self-aligned, single polysilicon transistor is fabricated using nitride spacers (26, 68) to self-align the extrinsic base regions (48, 80). The space between the base contacts (36, 76) and the emitter contacts (34, 78) is defined by the width of the nitride spacer plug (26, 68) less the oxide encroachment from a thermal oxidation of the underlying polysilicon.

18 Claims, 2 Drawing Sheets

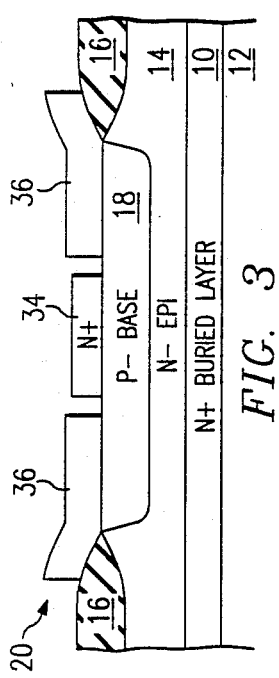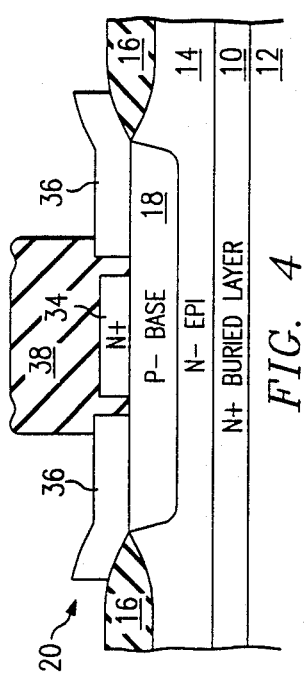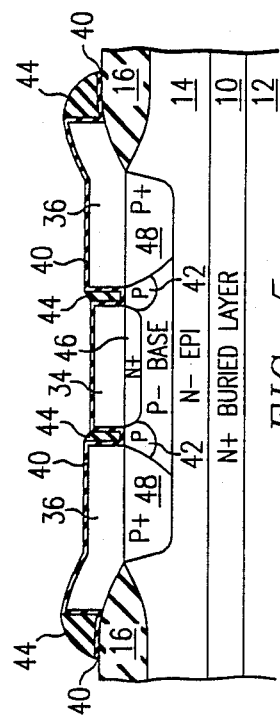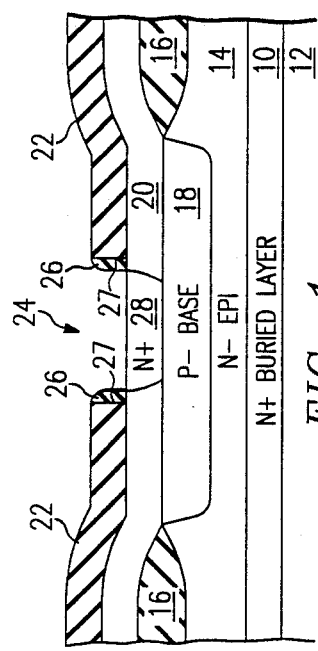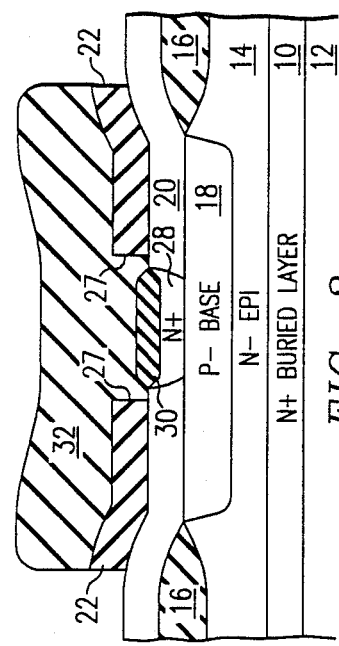

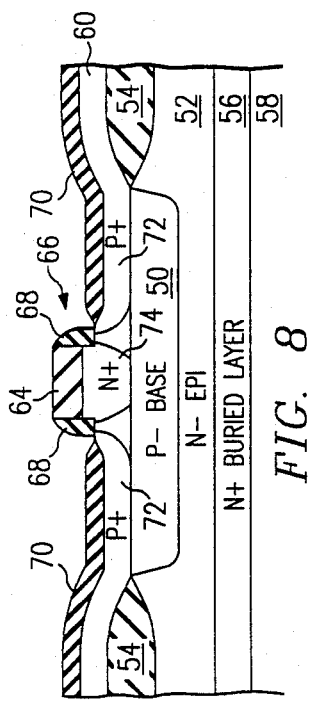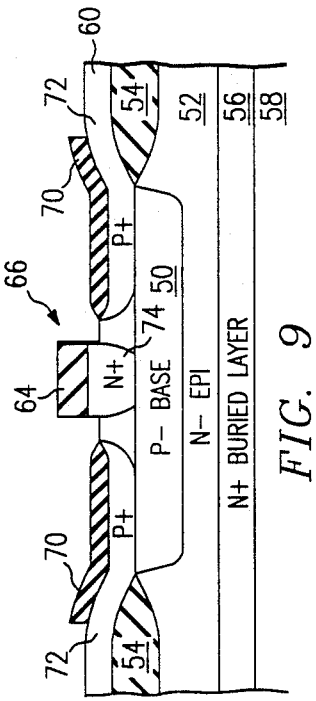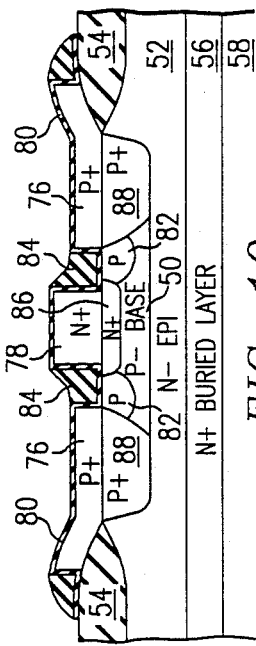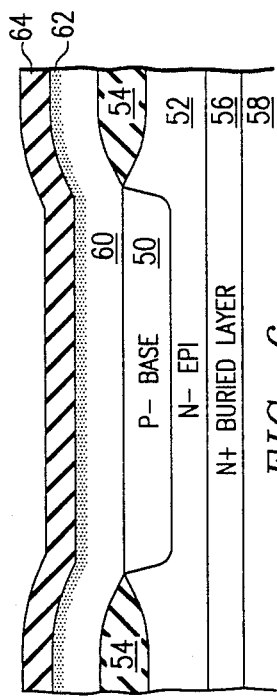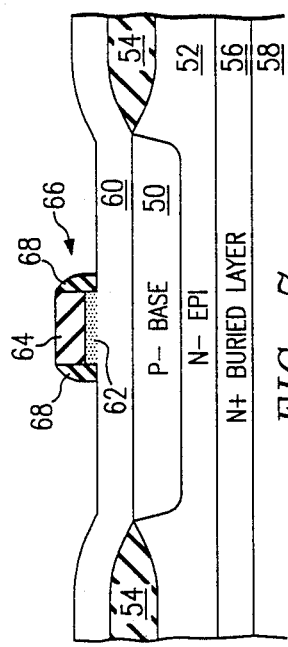

METHOD OF MAKING SINGLE POLYSILICON SELF-ALIGNED TRANSISTOR

TECHNICAL FIELD OF THE INVENTION

This invention pertains in general to integrated circuits and more particularly to a single polysilicon self-aligned transistor structure.

BACKGROUND OF THE INVENTION

Recently, a method of forming bipolar transistors using a self-aligning technique has been developed. One such method is disclosed in a pending U.S. Patent Application, entitled "A Polysilicon Self-Aligned Bipolar Device and Process of Manufacturing the Same," filed Nov. 19, 1986, Ser. No. 932,752, the subject matter of which is incorporated herein by reference in its entirety. Double-poly self-aligned transistors use a first polysilicon layer to form the base contacts and a second polysilicon layer to form the emitter contact.

While single polysilicon layer transistors have been developed, the process is not fully self-aligning. Self-alignment allows the spacing between the base and emitter contacts to be minimized, thereby minimizing base resistance and reducing the collector-base junction area. By reducing the junction area, the parasitic capacitance of the device is similarly reduced.

Recently, a transistor has been developed wherein a single polysilicon layer is used for the base and emitter contacts; however, the spacing between the base and emitter contacts is defined by a photomask. Therefore, the spacing between the contacts is limited by the capability of the photolithographic process.

Therefore, a need has arisen for a method of forming a single polysilicon self-aligned transistor structure having minimum separation between the base and emitter contacts.

SUMMARY OF THE INVENTION

In accordance with the present invention, a method of forming a self-aligned transistor having a single polysilicon layer is provided. In a first embodiment of the present invention, a polysilicon layer is formed over a base region. A dielectric layer is formed over the polysilicon layer and a window is etched therein. Nitride spacers are formed on the sidewalls of the window and a dopant of a first conductivity type is implanted through the window into the polysilicon therebelow. Thereafter, an oxide region is grown between the nitride spacers using a thermal LOCOS process. The dielectric and oxide layers are used as a mask during an etch which forms the contact regions therebelow. The emitter contact, formed under the oxide layer is masked with photoresist while the base contacts, formed under the dielectric layers, are implanted with a dopant of a second conductivity type. An anneal is performed to diffuse dopants from the base and emitter contacts into the base region to form the emitter and extrinsic base regions.

The present invention provides the technical advantage that the space between the emitter contacts can be as small as the width of the nitride spacer minus the encroachment thereunder by the oxide region. It is estimated that this distance may be as small as 0.1 micrometers using conventional techniques. Therefore, the emitter region may be self-aligned in close proximity to the extrinsic bases reducing the base resistance of the device. Furthermore, the base-collector junction area may be minimized, reducing the parasitic capacitance of the device.

In the second embodiment of the present invention, a polysilicon layer is formed over the base region and the top surface of the polysilicon layer is implanted at low energy with a dopant of the first conductivity type. A dielectric layer is formed thereover. An etch is performed on the dielectric layer and the doped portion of the polysilicon layer leaving an elevated portion which defines an emitter contact. Nitride spacers are formed on the sidewalls of the elevated portion and oxide regions are formed using a LOCOS oxidation of the exposed polysilicon. The polysilicon layer is implanted with a dopant of the second conductivity type; the dopant will penetrate the relatively thin LOCOS oxide layer, but will not be able to penetrate the thicker dielectric portion overlying the elevated region. Thereafter, the nitride spacers are removed and the polysilicon is etched, resulting in emitter and base contacts. Dopants from the emitter and base contacts are diffused into the base region to form the emitter and extrinsic base regions.

The second embodiment of the present invention also provides the technical advantage of self-alignment with a single polysilicon process, thereby providing reduced parasitic capacitance and base resistance.

BRIEF DESCRIPTION OF THE DRAWINGS

For a more complete understanding of the present invention and the advantages thereof, reference is now made to the following descriptions taken in conjunction with the accompanying drawings in which:

FIG. 1 illustrates a cross-sectional side view of a first embodiment of the transistor of the present invention after a first processing stage;

FIG. 2 illustrates a cross-sectional side view of a first embodiment of the transistor of the present invention after a second processing stage;

FIG. 3 illustrates a cross-sectional side view of a first embodiment of the transistor of the present invention after a third processing stage;

FIG. 4 illustrates a cross-sectional side view of a first embodiment of the transistor of the present invention after a fourth processing stage:

FIG. 5 illustrates a cross-sectional side view of a first embodiment of the transistor of the present invention after a fifth processing stage;

FIG. 6 illustrates a cross-sectional side view of a second embodiment of the transistor of the present invention after a first processing stage:

FIG. 7 illustrates a cross-sectional side view of a second embodiment of the transistor of the present invention after a second processing stage:

FIG. 8 illustrates a cross-sectional side view of a second embodiment of the transistor of the present invention after a third processing stage:

FIG. 9 illustrates a cross-sectional side view of a second embodiment of the transistor of the present invention after a fourth processing stage: and FIG. 10 illustrates a cross-sectional side View of a second embodiment of the transistor of the present invention after a fifth processing stage.

DETAILED DESCRIPTION OF THE INVENTION

The preferred embodiment of the present invention is best understood by referring to FIGS. 1–10 of the drawings, like numerals being used for like and corresponding parts of the various drawings.

FIG. 1 illustrates a cross-sectional side view of the first embodiment of the transistor of the present invention after a first processing stage. For the purposes of illustration, a NPN transistor is shown, although the technique could be used for other transistors as well. A N+ buried layer 10 is formed on a semiconductor substrate 12. A N− epitaxial layer 14 is formed on top of the N+ buried layer 10. Field oxide regions 16 are formed in the N− epitaxial layer 14, typically through a LOCOS (local oxidation of silicon) process, to define a base region. A P− base region 18 is formed in the N− epitaxial layer 14 by diffusing a P type dopant into the N− epitaxial layer 14. A polysilicon layer 20 is formed over the P− base region 18 and field oxide regions 16 by deposition. A dielectric layer 22 is formed over the polysilicon layer 20. Typically, the dielectric layer 22 comprises an oxide layer (SiO$_2$), a nitride layer (Si$_3$N$_4$) or a combination thereof. The dielectric layer 22 is masked and etched to form a window 24 in the dielectric layer 22 exposing the underlying polysilicon layer 20. Nitride sidewall regions 26 are formed on the sidewall 27 of the dielectric layer 22 using a conformed deposition of nitride followed by an anisotropic etch. An N+ region 28 is implanted into the polysilicon layer 20 using an N type dopant such as arsenic (As).

FIG. 2 illustrates a cross-sectional side view of the first embodiment of the present invention after a second processing stage. An oxide layer 30 is formed by LOCOS oxidation of the polysilicon layer 20. The oxide layer 30 will grow only where the polysilicon layer 20 is exposed along with a slight encroachment beneath the nitride sidewall regions 26. Thereafter, the nitride sidewall regions 26 are removed using a selective etching process. A photoresist layer 32 is disposed over the 10 dielectric layer 22 and an etch is performed on the dielectric layer 22. Thereafter, the photoresist layer 32 is removed.

FIG. 3 illustrates a cross-sectional side view of the first embodiment of the present invention after a third processing stage. An etch is performed on the polysilicon layer 20 as masked by the remaining portions of the dielectric layer 22 and the oxide layer 30. Thereafter, the dielectric and oxide layers 22 and 30 respectively, are removed using an etch selective to silicon. The polysilicon etch results in three polysilicon regions: an emitter contact 34 and two base contacts 36. The emitter contact 34 has an N+ doping by virtue of the arsenic implant performed in connection with FIG. 1.

FIG. 4 illustrates a cross-sectional side view of the first embodiment of the present invention after a fourth processing stage. A photoresist mask 38 is formed over the emitter contact 34 exposing the base contacts 36. The base contacts 36 are implanted with a P type dopant such as boron. Subsequently, the photoresist mask is removed.

FIG. 5 illustrates a cross-sectional side view of the first embodiment of the present invention after a fifth processing stage. A thin oxide layer 40 is formed over the integrated circuit. A base "link" implant is performed between the base contact 36 and the emitter contact 34 to form P type diffused regions 42, which ensure the continuity of the base 18 in the event of over-etching in forming the emitter and base contacts 34 and 36 respectively.

Thereafter, a thick oxide layer is deposited over the surface of the integrated circuit. The thick oxide layer is etched back to expose the upper surfaces of the emitter and base contacts, leaving oxide regions 44 between the emitter and base contacts. An annealing cycle diffuses dopants from the emitter and base contacts 34 and 36 to form the emitter 46 and extrinsic base regions 48, respectively. Subsequently, the emitter and base contacts 34 and 36 are silicided to reduce the resistance of the polysilicon.

This embodiment of the present invention provides the technical advantage of forming self-aligned emitter and base regions in a single polysilicon layer process. The space between the emitter and base contacts 34 and 36 is defined by a nitride spacer, Which may be accurately controlled to dimensions below conventional photolithic processes.

FIGS. 6–10 illustrate the formation of a second embodiment of the present invention. FIG. 6 illustrates the second embodiment of the present invention after a first processing stage. A P− base 50 is defined in an N− epitaxial layer 52 by field oxide regions 54. The epitaxial layer 52 overlies an N+ buried layer 56 formed over a substrate 58. A polysilicon layer 60 is formed over the base 50 and oxide regions 54 by deposition. A low energy arsenic implant is used to create a doped layer 62 in the upper regions of the polysilicon layer 60. A dielectric layer 64 is formed over the doped layer 62. Typically, the dielectric layer 64 comprises an oxide or nitride layer.

FIG. 7 illustrates the second embodiment of the present invention after a second processing stage. The dielectric layer 64 is masked to define an emitter region. An etch is performed on the dielectric layer 64 and the doped layer 62 to form an elevated portion 66. Nitride spacers 68 are formed on the sidewall of the elevated portion 66 by a conformal deposition followed by an anisotropic etch back.

FIG. 8 illustrates the second embodiment of the present invention after a third processing stage. The polysilicon layer 60 is oxidized using a low temperature LOCOS process to form oxide layer 70. A boron implant is performed through the oxide layer 70 into the polysilicon layer 60 therebelow to create P+ regions 72. N+ region 74 is formed by diffusion of the dopants from the doped layer 62 into the polysilicon layer 60.

FIG. 9 illustrates this invention after a fourth processing stage. The nitride spacers 68 are stripped, and the oxide layers 70 are masked and etched to define oxide masks over the polysilicon layers 60. The oxide masks 70 define the base contacts in the polysilicon layers 60 therebelow.

FIG. 10 illustrates the second embodiment of the present invention after a fifth processing stage An anisotropic etch is performed through the polysilicon layer 60, resulting in base contact regions 76 and emitter contact region 78. After removal of the oxide layer 70 and the dielectric layer 64, a thin oxidation 80 is performed on the exposed polysilicon and a base link implant is performed, as described in connection with FIG. 5, creating base link regions 82. Oxide regions 84 are formed by depositing an oxide layer over the surface of the integrated circuit and performing an anisotropic etch back. Thereafter, the emitter 86 and extrinsic base regions 88 are formed in the P− base 50 during an anneal step. Silicide regions 90 are formed on the exposed portions of the base and emitter contacts 76 and 78 to reduce resistance thereof.

The second embodiment of the present invention maintains the same advantages as the first embodiment.

The spacing between the base and emitter contacts, and hence the space between the emitter 86 and extrinsic base regions 88, can be made as small as the width of the nitride spacers 68 less the encroachment by the oxide layer 70. This spacing can be accurately controlled using conventional photolithographic techniques.

Although the present invention has been described in detail, it should be understood that various changes, substitutions and alterations can be made herein without departing from the spirit and scope of the invention as defined by the appended claims.

What is claimed is:

1. A method of forming a self-aligned transistor comprising the steps of:
    forming a base region in a semiconductor surface;
    forming a material layer over said base region;
    doping said material layer;
    forming a first masking layer over said material layer to define an emitter region;
    forming spacer regions on the sidewalls of said first masking layer;
    forming a second masking layer overlying portions of said material layer not underlying said first masking layer or said sidewall regions;
    removing said spacer regions;
    removing portions of said material layer not covered by said first or second masking layer; and
    diffusing dopants from said material layer into said base region.

2. The method of claim 1 wherein said step of forming a material layer comprises the step of forming a polysilicon layer over said base region.

3. The method of claim 1 wherein said step of forming a first masking layer comprising the steps of:
    forming a first masking layer overlying said material layer; and
    removing a portion of said first masking layer overlying said base region where a emitter is desired.

4. The method of claim 3 wherein said step of doping said material layer comprises the step of doping an area of said material layer underlying said removed portion of said first masking layer.

5. The method of claim 1 wherein said step of forming a first masking layer comprises the steps of:
    forming a first masking layer overlying said material layer; and
    removing portions of said first masking layer not overlying said base region where an emitter is desired.

6. The method of claim 5 wherein said step of doping said material layer comprises doping the upper surface of said material layer prior to forming said masking layer.

7. The method of claim 6 and further comprising the step of removing portions of said upper surface of said material layer underlying said removed portions of said first masking layer.

8. The method of claim 1 wherein said step of forming said spacer regions comprises the steps of:
    forming a conformal nitride layer over said material layer and first masking layer; and
    anisotropically etching said nitride layer.

9. The method of claim 2 wherein said step of forming a second masking layer comprises the step of thermally oxidizing said material layer.

10. A method of forming a self-aligned transistor, comprising the steps of:
    forming a base region in a semiconductor surface;
    forming a material layer overlying said base region;
    forming a first masking layer overlying said material layer having a window exposing said material layer and defining an emitter in said base region;
    forming spacer regions on the sidewalls of said window;
    doping a portion of said material layer overlying said defined emitter;
    forming a second masking layer on portions of said material layer not covered by said first masking layer or said spacer regions;
    removing said spacer regions;
    removing portions of said material layer not covered by said first or second masking layers; and
    diffusing dopants from said material layer into said base region.

11. The method of claim 10 wherein said step of doping said material layer comprises the step of implanting a dopant through said window into said material layer.

12. The method of claim 10 and further comprising the step of removing portions of said first masking layer to define base contact regions in said material layer.

13. The method of claim 12 and further comprising the set of doping said base contact regions.

14. The method of forming a self-aligned transistor, comprising the steps of:
    forming a base region in a semiconductor surface;
    forming a material layer over said base regions;
    doping the upper surface of said material layer;
    forming a first masking layer overlying said material layer and defining an emitter in said base region;
    removing portions of said upper surface not covered by said first mask;
    forming spacer regions adjacent said first mask;
    forming a second mask overlying portions of said material layer not covered by said first masking layer or said spacer regions;
    removing said spacer regions;
    removing portions of said material layer not covered by said first or second masking layers; and
    diffusing dopants from said material layer into said base region.

15. The method of claim 14 wherein said step of forming spacer regions comprises the steps of:
    forming a conformal nitride layer over said material layer in said first mask; and
    anisotropically etching said nitride layer.

16. The method of claim 15 wherein said step of forming a second mask comprises the step of thermally oxidizing portions of said material layer not covered by said first masking layer or said spacing regions.

17. The method of claim 14 and further comprising the steps of removing portions of said second mask to define base contact regions.

18. The method of claim 17 and further comprising the step of doping said base contact regions.

* * * * *

UNITED STATES PATENT AND TRADEMARK OFFICE
CERTIFICATE OF CORRECTION

PATENT NO. : 4,839,305

DATED : June 13, 1989

INVENTOR(S) : Jeffrey E. Brighton

It is certified that error appears in the above-identified patent and that said Letters Patent is hereby corrected as shown below:

Claim 3, line 6, change. "a" to --an--.

Claim 13, line 2, change "set" to --step--.

Signed and Sealed this

Twentieth Day of February, 1990

Attest:

JEFFREY M. SAMUELS

Attesting Officer

Acting Commissioner of Patents and Trademarks